(12) United States Patent
Zalyubovskiy et al.

(10) Patent No.: US 8,165,833 B2
(45) Date of Patent: Apr. 24, 2012

(54) WIRELESS SENSOR NETWORK SYSTEMS, METHOD FOR PLACING A PLURALITY OF SENSOR NODES IN WIRELESS SENSOR NETWORK SYSTEM, AND METHODS FOR COMPUTING SENSING ENERGY CONSUMPTION PER AREA OF A PLURALITY OF SENSOR NODES

(75) Inventors: Vyacheslav Zalyubovskiy, Suwon-si (KR); Hyunseung Choo, Gwacheon-si (KR); Minhan Shon, Namyangju-si (KR); Jaehyung Lee, Seoul (KR); Sam Yeoul Choi, Paju-si (KR); In Hur, Suwon-si (KR)

(73) Assignee: Sungkyunkwan University Foundation for Corporate Collaboration, Gyeonggi-do (KR)

( * ) Notice: Subject to any disclaimer, the term of this patent is extended or adjusted under 35 U.S.C. 154(b) by 549 days.

(21) Appl. No.: 12/356,315

(22) Filed: Jan. 20, 2009

(65) Prior Publication Data
US 2010/0169032 A1 Jul. 1, 2010

(30) Foreign Application Priority Data

Dec. 30, 2008 (KR) .......................... 10-2008-0137310

(51) Int. Cl.
*G06R 15/00* (2006.01)
(52) U.S. Cl. .......................................................... 702/61
(58) Field of Classification Search ..................... 702/61
See application file for complete search history.

(56) References Cited

OTHER PUBLICATIONS

Kenan Xu, Device Deployment Strategies for Large-scale Wireless Sensor Networks, Jan. 2008, p. 1-194.*

* cited by examiner

*Primary Examiner* — Tung S Lau
(74) *Attorney, Agent, or Firm* — Harness, Dickey & Pierce, P.L.C.

(57) ABSTRACT

A wireless sensor network system, a method for placing a plurality of sensor nodes in a wireless sensor network, and a method for computing sensing energy consumption per area of a plurality of sensor node are disclosed. The wireless sensor network system includes a plurality of sensor nodes which are deployed at the same distance in a two-dimensional plane and have sensing areas of the same size, and an extra sensor node which has a sensing area of a smaller size than the size of the sensor nodes to sense a gap area which is not covered by the sensing areas of the sensor nodes.

4 Claims, 9 Drawing Sheets

| | A-1 | A-2 | A-3 | B-1 | B-2 | B-3 |
|---|---|---|---|---|---|---|
| SECPA | 1.20$\mu_1$ | 1.51$\mu_1$ | 1.10$\mu_1$ | 1.57$\mu_1$ | 1.57$\mu_1$ | 1.17$\mu_1$ |
| CECPA | 1.15$\mu_2$ | 1.15$\mu_2$ | 1.15$\mu_2$ | $\mu_2$ | $\mu_2$ | $\mu_2$ |

WIRELESS SENSOR NETWORK SYSTEMS, METHOD FOR PLACING A PLURALITY OF SENSOR NODES IN WIRELESS SENSOR NETWORK SYSTEM, AND METHODS FOR COMPUTING SENSING ENERGY CONSUMPTION PER AREA OF A PLURALITY OF SENSOR NODES

CLAIM FOR PRIORITY

This application claims priority to Korean Patent Application No. 2008-0137310 filed on Dec. 30, 2008 in the Korean Intellectual Property Office (KIPO), the entire contents of which are hereby incorporated by reference.

BACKGROUND

1. Technical Field

Example embodiments of the present invention relate in general to a wireless sensor network and more specifically to a wireless sensor network system, a method for placing a plurality of sensor nodes in a wireless sensor network system, and a method for computing sensing energy consumption per area of a plurality of sensor nodes.

2. Description of the Related Art

A wireless sensor network having a plurality of sensor nodes such as a ubiquitous sensor network is widely used. A wireless sensor network is configured such that a plurality of sensor nodes are densely deployed and are connected by a wireless interface.

A sensor node in a wireless sensor network system performs tasks which collect data, aggregate data and transmit data. In most cases, the tasks require much more energy than a task which processes data at other network node (data processing node). For this reason, it is a main issue of a wireless sensor network system how to reduce the amount of energy consumed when a sensor node performs tasks.

The energy consumption optimization has been researched based on two approaches. A first approach is to perform scheduling to activate some of sensor nodes, and a second approach is to adjust a sensing range to reduce redundant energy consumption.

In case of the second approach, it is very important how to place sensor nodes when seen in a two-dimensional plane and how to set a sensing range of each sensor node.

Each sensing area range has to be optimally set to minimizes the overlap of the sensing areas and to prevent an occurrence of a gap area which does not belong to any sensing area range. Conventionally, research has been conducted under the assumption that all sensor nodes have the same sensing area range, but the assumption has a limitation to reducing a gap area.

Meanwhile, in order to set an optimum sensing range, it is necessary to compute sensing energy consumption per area ("SECPA"). According to a conventional SECPA computation technique, a tile area is defined by connecting adjacent sensor nodes, and energy consumption within the tile area is computed. The tile area has many overlap areas that sensor nodes overlap each other. However, the conventional SECPA computation technique has an error factor since it considers only the whole sensing area but does not consider overlap areas in which sensor nodes overlap each other. This has an influence on setting of an optimum sensing area range.

A conventional SECPA computation is described in an article by J. Wu and S. Yang (J. Wu and S. Yang, "Energy-Efficient Node Scheduling Models in Sensor Networks with Adjustable Ranges", International Journal of Foundations of Computer Science, Vol. 16, No. 1, 2005 3-17).

SUMMARY

Accordingly, example embodiments of the present invention is provided to substantially obviate one or more problems due to limitations and disadvantages of the related art.

Example embodiments of the present invention provide a wireless sensor network system which includes a plurality of sensor nodes.

Example embodiments of the present invention also provide a method for placing a plurality of sensor nodes in a wireless sensor network system.

Example embodiments of the present invention also provide a method for computing sensing energy consumption per area of a plurality of sensor nodes in a wireless sensor network system.

In some example embodiments, a wireless sensor network system comprises: a plurality of sensor nodes which are deployed at the same distance in a two-dimensional plane and have sensing areas of the same size; and an extra sensor node which has a sensing area of a smaller size than the size of the sensor nodes to sense a gap area which is not covered by the sensing areas of the sensor nodes.

The plurality of sensor nodes are deployed such that a tile area defined by connecting three adjacent sensor nodes among the plurality of sensor nodes has an equilateral triangle shape.

The extra sensor node is deployed at a center of the tile area, a radius of the sensing area of the extra sensor node is $r=R/\sqrt{31} \approx 0.1796R$ when the sensing area of the sensor nodes is R, the length of one side of the tile area is $a=2(R-x)=6R\sqrt{3}/\sqrt{31} \approx 1.8665R$, and the length of a portion of one side of the tile area in which the sensing areas of the sensor nodes is $2x=2R(\sqrt{31}-3\sqrt{3})/\sqrt{31} \approx 0.1335R$.

The plurality of sensor nodes are deployed such that a tile area defined by connecting four adjacent sensor nodes among the plurality of sensor nodes has a square shape.

The extra sensor node is deployed at a center of the tile area, a radius of the sensing area of the extra sensor node is $r=R/\sqrt{5} \approx 0.4472R$ when the sensing area of the sensor nodes is R, the length of one side of the tile area is $a=2(R-x)=4R/\sqrt{5} \approx 1.7889R$, and the length of a portion of one side of the tile area in which the sensing areas of the sensor nodes is $2x=2R(\sqrt{5}-2)/\sqrt{5} \approx 0.2111R$.

In other example embodiments, a method for placing a plurality of sensor nodes in a two-dimensional plane in a wireless sensor network system, includes: placing a plurality of sensor nodes at the same distance to have sensing areas of the same size; and placing an extra sensor node to have a sensing area of a smaller size than the sensing areas of the sensor nodes and to sense a gap area which is not covered by the sensing areas of the sensor nodes.

The placing a plurality of sensor nodes at the same distance to have sensing areas of the same size comprises placing the plurality of sensor nodes such that a tile area defined by connecting three adjacent sensor nodes has an equilateral triangle shape.

The extra sensor node is placed at a center of the tile area, a radius of the sensing area of the extra sensor node is $r=R/\sqrt{31} \approx 0.1796R$ when the sensing area of the sensor nodes is R, the length of one side of the tile area is $a=2(R-x)=6R\sqrt{3}/\sqrt{31} \approx 1.8665R$, and the length of a portion of one side of the tile area in which the sensing areas of the sensor nodes is $2x=2R(\sqrt{31}-3\sqrt{3})/\sqrt{31} \approx 0.1335R$.

The placing a plurality of sensor nodes at the same distance to have sensing areas of the same size comprises placing the plurality of sensor nodes such that a tile area defined by connecting four adjacent sensor nodes has a square shape.

The extra sensor node is deployed at a center of the tile area, a radius of the sensing area of the extra sensor node is $r=R/\sqrt{5}\approx0.4472R$ when the sensing area of the sensor nodes is R, the length of one side of the tile area $a=2(R-x)=4R/\sqrt{5}\approx1.7889R$, and the length of a portion of one side of the tile area in which the sensing areas of the sensor nodes is $2x=2R(\sqrt{5}-2)/\sqrt{5}\approx0.2111R$.

In other example embodiments, a method for computing sensing energy consumption per area of a plurality of sensor nodes in a wireless sensor network system, includes: computing sensing energy consumption per area (SECPA) E using Equation 1:

$$E=\mu_1/K,\qquad\text{Equation 1}$$

where $\mu_1$ denotes power consumption per unit, K denotes efficiency factor, wherein the efficiency factor K is defined by Equation 2:

$$K=S_p/S_f,\qquad\text{Equation 2}$$

where $S_p$ denotes the size of a tile area defined by connecting predetermined adjacent sensor nodes among the plurlaity of sensor nodes, and $S_f$ denotes a sum of the sizes of areas which exist within the tile area among sensing areas of the plurality of sensor nodes.

BRIEF DESCRIPTION OF THE DRAWINGS

Example embodiments of the present invention will become more apparent by describing in detail example embodiments of the present invention with reference to the accompanying drawings, in which:

FIG. 4 is a table illustrating a comparison result of the SECPAs of the models of FIGS. 1A and 1B to FIGS. 3A and 3B;

DETAILED DESCRIPTION OF EXAMPLE EMBODIMENTS

Figure 1:
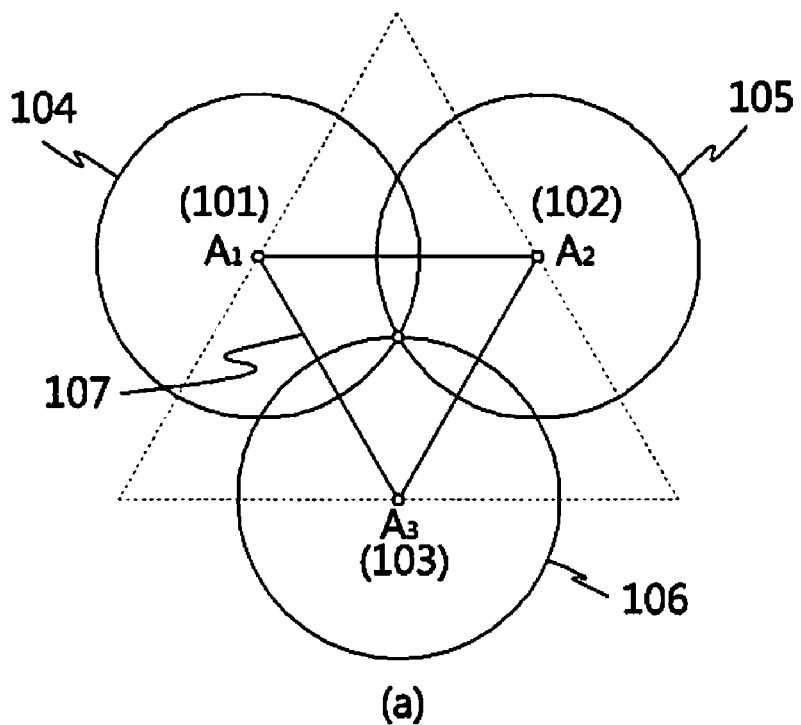
FIGS. 1A and 1B schematic diagrams illustrating a method for computing sensing energy consumption per area of a plurality of sensor nodes in a wireless sensor network system according to an exemplary embodiment of the present invention.
Figure 1:
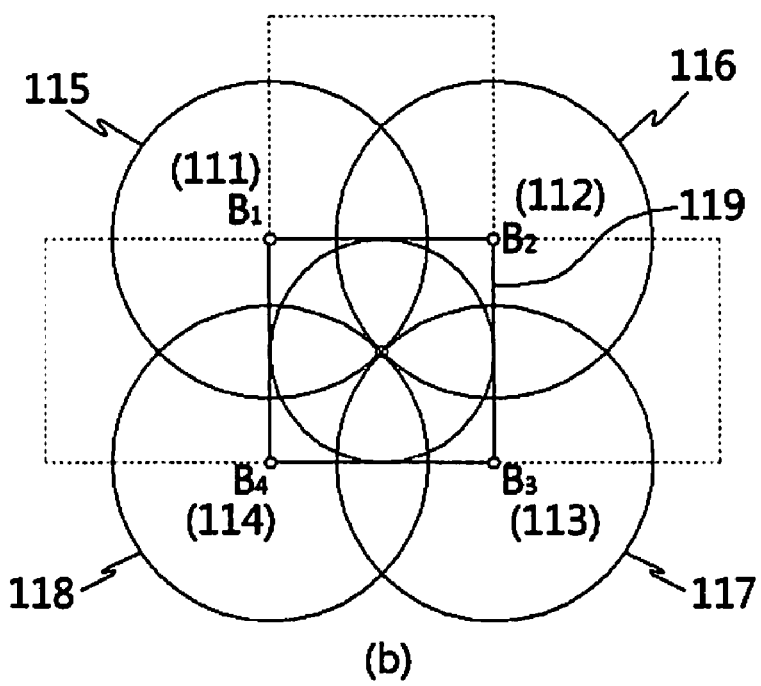

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

The present invention provides a wireless sensor network of the present invention and a method for placing a plurality of sensor nodes in a wireless sensor network in which sensing energy consumption per area of a wireless sensor network system can be minimized by deploying an extra sensor node with the optimum size to cover a gap area which is not covered by sensing areas of sensor nodes. The present invention also provides a method for computing sensing energy consumption per area in which energy consumption in overlap areas in which sensing areas overlap in a tile area is considered, so that sensing energy consumption per area (SPECPA) can be accurately computed. Consequently, sensor nodes can be optimally deployed, and sensing area ranges can be optimally set.

Hereinafter, exemplary embodiments of the present invention will be described in detail with reference to the accompanying drawings.

First, a method for computing sensing energy consumption per area of a sensor node according to an exemplary embodiment of the present invention will be described.

FIGS. 1A and 1B schematic diagrams illustrating a method for computing sensing energy consumption per area of a plurality of sensor nodes in a wireless sensor network system according to an exemplary embodiment of the present invention.

Referring to FIG. 1A, a wireless sensor network system includes a plurality of sensor nodes $A_1$ 101, $A_2$ 102 and $A_3$ 103. The sensor nodes 101 to 103 have sensing areas 104 to 106, respectively. The sensing areas 104 to 106 have a disk-like sensing area of the same size and overlap each other a lot.

As shown in FIG. 1A, the sensing areas 104 to 106 has a circular disk form due to a characteristic of a wireless sensor node. Therefore, it is necessary to overlap the sensing areas 104 to 106 in order to prevent gap areas which are not covered by the sensing areas 104 to 106. The sensor nodes 101 to 106 can be optimally placed when overlap areas are minimized.

In order to compute sensing energy consumption per area of overlap areas, a tile area 107 is defined by connecting adjacent three sensor nodes 101 to 103. In FIG. 1A, the tile area 107 has an equilateral triangle shape.

Sensing energy consumption per area E of the tile area 107 can be computed by Equation 1:

$$E=\mu_1/K,\qquad\text{Equation 1}$$

where $\mu_1$ denotes power consumption per unit, and K denotes efficiency factor.

K can be defined by Equation 2:

$$K=S_p/S_f,\qquad\text{Equation 2}$$

where $S_p$ denotes the size of a tile area defined by connecting predetermined adjacent sensor nodes among a plurlaity of sensor nodes, and $S_f$ denotes a sum of the sizes of areas which exist within a tile area among sensing areas of a plurality of sensor nodes.

There exist overlap areas that are doubly influenced by the sensing areas 104 to 106 within the tile area 107, and the efficiency factor K is employed to consider overlap areas.

Referring to FIG. 1A, $S_p$ is the size of the tile area 107 of an equilateral triangular in which the sensor nodes 101 to 103 are used as three vertices, and $S_f$ is a sum of the sizes of areas of the sensing areas 104 to 106 which exist within the tile area 107 among the sensing areas 104 to 106 (that is, a sum of three fan-shaped areas).

In FIG. 1A, the efficiency factor can be computed like Equation 3:

$$S_{P_{A-1}} = R^2 3\sqrt{3}/4, \quad S_{f_{A-1}} = \pi R^2/2,$$

$$K_{A-1} = S_{P_{A-1}}/S_{f_{A-1}} = 3\sqrt{3}/(2\pi) \approx 0.8272. \qquad \text{Equation 3.}$$

Meanwhile, sensing energy consumption per area of the model of FIG. 1A can be computed using Equations 1 and 3 like Equation 4:

$$E_{A-1} = \mu_1 2\pi/(3\sqrt{3}) \approx 1.2091 \mu_1 \qquad \text{Equation 4.}$$

Meanwhile, unlike FIG. 1A, sensor nodes 111 to 114 can be deployed in the form of a square as shown in FIG. 1B.

In case of FIG. 1B, the efficiency factor can be computed using Equation 2 like Equation 5:

$$S_{P_{B-1}} = 2R^2, \quad S_{f_{B-1}} = \pi R^2,$$

$$K_{B-1} = S_{P_{B-1}}/S_{f_{B-1}} = 2/\pi \approx 0.6366. \qquad \text{Equation 5}$$

Sensing energy consumption per area can be computed using Equations 1 and 5 like Equation 6:

$$E_{B-1} = \mu_1 \pi/2 \approx 1.5708 \mu_1 \qquad \text{Equation 6.}$$

A maximum value of the efficiency factor K is one (1) as can be intuited. The larger the value of K is, the smaller the size of the sensing areas overlapped within the tile area is, and so the higher the efficiency is. Of course, the larger the value of K is, the smaller sensing energy consumption per area E is.

A wireless sensor network system having a plurality of sensor nodes and a method for placing a plurality of sensor nodes according to exemplary embodiments of the present invention will be described below.

Figure 2:
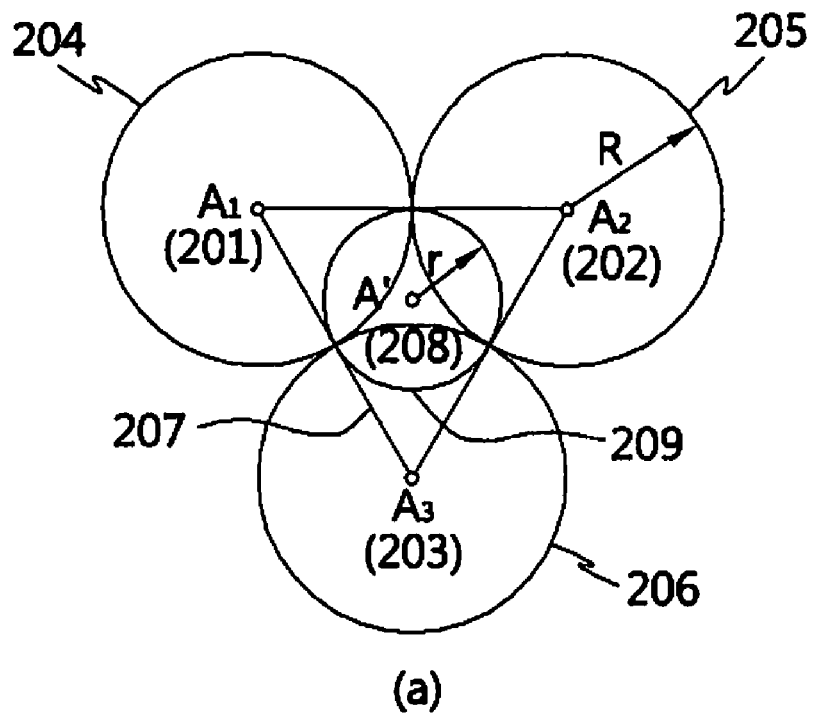
FIGS. 2A and 2B are schematic diagrams illustrating a method for placing a plurality of sensor nodes according to an exemplary embodiment of the present invention.
Figure 2:
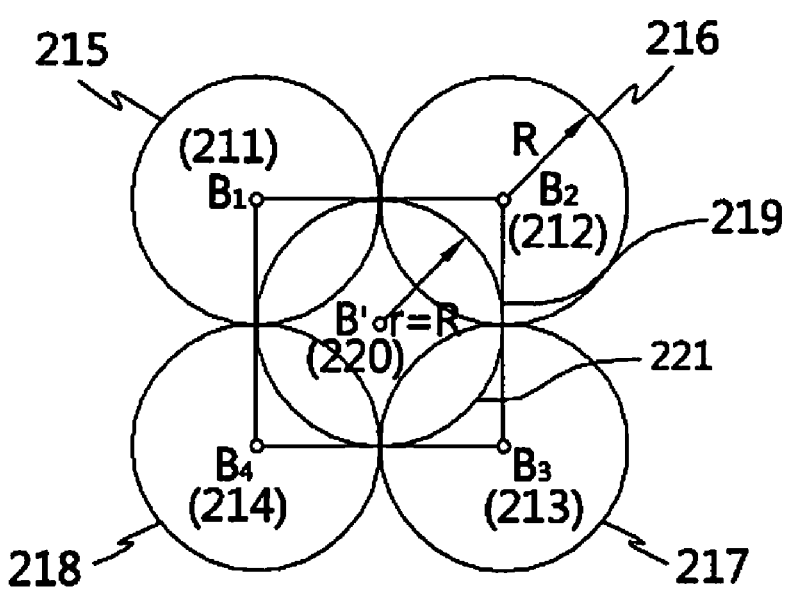

FIGS. 2A and 2B are schematic diagrams illustrating a method for placing a plurality of sensor nodes according to an exemplary embodiment of the present invention.

Referring to FIG. 2A, the wireless sensor network includes sensor nodes $A_1$ 201, $A_2$ 202 and $A_3$ 203. Sensing areas 204 to 206 of the sensor nodes 201 to 203 are set to have a range of the same size (radius R). The sensor nodes 201 to 203 are deployed so that the sensing areas 204 to 206 can be tangent to each other.

At this time, a gap area which is not covered by any of the sensing areas 204 to 206 exists at a center between the sensing areas 204 to 206. A discrete extra sensor node A' 208 having a sensing area 207 of the different size from the sensing areas 204 to 206 is deployed to cover the gap area.

The extra sensor node 208 is deployed at a center of a triangular tile area 207 defined by connecting the sensor nodes 201 to 203, and the size (radius r) of the sensing area 209 is set so that the sensing area 209 of the extract sensor node 208 can be inscribed in a triangle of the tile area 207.

Another exemplary embodiment of the present invention is shown in FIG. B. The model of FIG. 2B is similar to that of FIG. 2A, but in the model of FIG. 2B, a tile area 319 has a square shape other than an equilateral triangular shape.

It is geometrically easily checked that $r = R/\sqrt{3}$ in the model of FIG. 2A, and $r = R$ in the model of FIG. 2B. The efficiency factor K and sensing energy consumption per area E for the models of FIGS. 2A and 2B can be obtained using the values.

For example, Equation 7 is a value of the efficiency factor K obtained in the model of FIG. 2A.

$$S_{P_{A-1}} = R^2 \sqrt{3}, \quad S_{f_{A-1}} = 5\pi R^2/6,$$

$$K_{A-2} = S_{P_{A-1}}/S_{f_{A-2}} = 6\sqrt{3}/(5\pi) \approx 0.6616 \qquad \text{Equation 7.}$$

Equation 8 is a value of sensing energy consumption per area E.

$$E_{A-2} = \frac{\mu_1 5\pi}{6\sqrt{3}} \approx 1.5115 \mu_1. \qquad \text{Equation 8}$$

Figure 3:
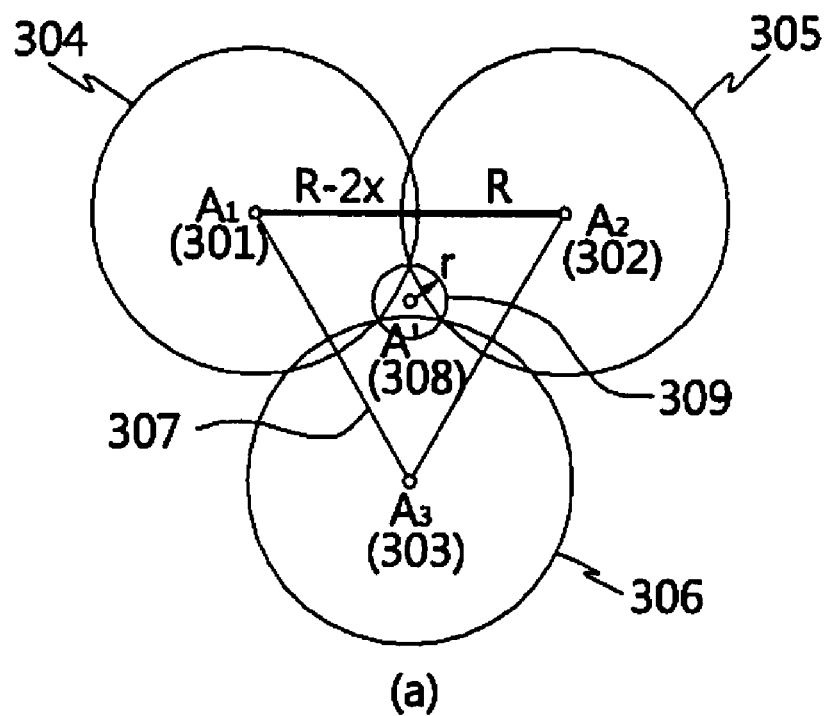
FIGS. 3A and 3B are schematic diagrams illustrating a method for placing a plurality of sensor nodes according to another exemplary embodiment of the present invention.
Figure 3:
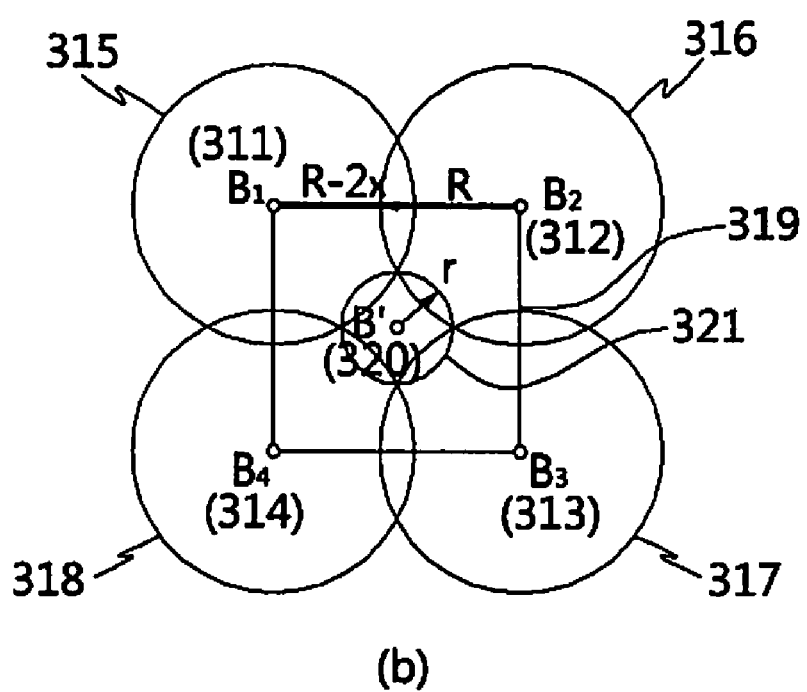

FIGS. 3A and 3B are schematic diagrams illustrating a method for placing a plurality of sensor nodes according to another exemplary embodiment of the present invention.

Referring to FIG. 3A, the wireless sensor network includes sensor nodes $A_1$ 301, $A_2$ 302 and $A_3$ 303. The model of FIG. 3A is different from the model of FIG. 2A in the fact that sensing areas 304 to 306 of the sensor nodes 301 to 303 are set to overlap each other a little.

In this instance, a gap area can exist. However, in the present embodiment, the sensor nodes 301 to 303 are deployed, the sensing areas 304 to 306 are set, and an extra sensor node A' 308 having an optimum sensing area 309 which covers a gap area is deployed, so that the gap area can be removed.

The sensor nodes 301 to 303 and the extra sensor node 308 can be placed using Equation 9:

$$r = R/\sqrt{31} \approx 0.1796R, \quad 2x = 2R(\sqrt{31} - 3\sqrt{3})/\sqrt{31} \approx 0.1335R,$$

$$a = 2(R-x) = 6R\sqrt{3}/\sqrt{31} \approx 1.8665R, \qquad \text{Equation 9.}$$

Equation 9 can be proven as follows.

Let us denote $r = t/\sqrt{3} - \sqrt{R^2 - t^2}$, where $t = R - x$. Then, $S_{P_{A-1}} = a^2\sqrt{3}/4 = (R-x)^2\sqrt{3} = t^2\sqrt{3}$, $S_{f_{A-1}} = \pi R^2/2 + \pi(t/\sqrt{3} - \sqrt{R^2 - t^2})^2$.

In order to minimize sensing energy consumption per area, it is necessary to solve the following optimization problem:

$$\frac{1}{K(t)} = \frac{S_{f_{A-1}}}{S_{P_{A-1}}} = \frac{\pi}{\sqrt{3}} \left( \frac{3R^2}{2r^2} - \frac{2}{3} - \frac{2\sqrt{R^2 - t^2}}{t\sqrt{3}} \right) \to \min_t.$$

The solution of the optimization problem is $t = 3R\sqrt{3}/\sqrt{31}$, and the other values are as follows:

$$x = R - t = R(\sqrt{31} - 3\sqrt{3})/\sqrt{31}, \quad r = t/\sqrt{3} - \sqrt{R^2 - t^2} = R/\sqrt{31}.$$

As a result, Equations 10 and 11 can be derived.

$$S_{P_{A-1}} = 27R^2\sqrt{3}/31, \quad S_{f_{A-3}} = 33\pi R^2/62, \quad K_{A-3} = 18\sqrt{3}/(11\pi) \approx 0.9022 \qquad \text{Equation 10}$$

$$E_{A-3} \approx 1.1084 \mu_1 \qquad \text{Equation 11.}$$

Similarly, in the model of FIG. 3B, the sensor nodes 311 to 313 and the extra sensor node B' 320 can be placed using Equation 12:

$$r = R/\sqrt{5} \approx 0.4472R, \quad 2x = 2R(\sqrt{5} - 2)/\sqrt{5} = 0.2111R,$$

$$a = 2(R-x) = 4R/\sqrt{5} \approx 1.7889R, \qquad \text{Equation 12.}$$

Equation 12 can be proven as follows.

Let us denote $r = t\sqrt{R^2 - t^2}$, where $t = R - x$. Then, $S_{P_{B-1}} = 4(R-x)^2 = 4t^2$ and $S_{f_{B-1}} = \pi R^2 + \pi(t - \sqrt{R^2 - t^2})^2$.

In order to minimize sensing energy consumption per area, it is necessary to solve the following optimization problem:

$$\frac{1}{K(t)} = \frac{S_{f_{B-3}}}{S_{P_{B-3}}} = \frac{\pi}{2}\left(\frac{R^2}{t^2} - \frac{\sqrt{R^2-t^2}}{t}\right) \to \min_t$$

Its solution is $t=2R\sqrt{5}$, then $x=R-t=R(\sqrt{5}-2)/\sqrt{5}$, $r=t-\sqrt{R^2-t^2}=R/\sqrt{5}$. $S_{P_{B-3}}=16R^2/5$, $S_{f_{B-3}}=6\pi R^2/5$, $K_{B-3}=16/(6\pi)\approx 0.8488$, and $E_{B-3}\approx 1.1781\mu_1$ are obtained.

Consequently, Equations 13 and 14 are derived.

$$S_{P_{A-3}}=27R^2\sqrt{3}/31, S_{f_{A-3}}=33\pi R^2/62, K_{A-3}=18\sqrt{3}/(11\pi)\approx 0.9022 \qquad \text{Equation 13.}$$

$$E_{A-3}\approx 1.1084\mu_1 \qquad \text{Equation 14.}$$

The SECPAs of the models of FIGS. 1A and 1B to FIGS. 3A and 3B are compared below.

FIG. 4 is a table illustrating a comparison result of the SECPAs of the models of FIGS. 1A and 1B to FIGS. 3A and 3B. In FIG. 4, A-1 and B-1 denote the models of FIGS. 1A and 1B, A-2 and B-2 denote the models of FIGS. 2A and B, and A-3 and B-3 denote the models of FIGS. 3A and 3B.

In the models A-1 and B-1, the extra sensor nodes are not used, and the sensor nodes are placed such that the sensing areas overlap each other to prevent the gap area.

In the models A-2 and B-2, the gap area is covered using the extra sensor node, and the sensor nodes and the extra sensor node are placed such that the sensing areas are tangent to each other.

In the models A-3 and B-3, the gap area is covered using the extra sensor node, and the locations of the sensor nodes and the sizes of the sensing areas are adjusted so that the sensing areas overlap each other a little and the sensor nodes and the extra sensor node can have an optimum placement.

Referring to FIG. 4, among the A-type models, A-3 as the smallest SECPA value, A-2 has the second smallest SECPA value, and among the B-type models, B-3 has the smallest SECPA value, and B-2 and B-1 has the second smallest SECPA value. Also, the model B-3 is smaller in SECPA value than the model A-3. That is, the models of FIGS. 3A and 3B are much more excellent in energy efficiency than the other models.

On the other hand, with respect to communication energy consumption per area (CECPA), the A-type models are equal to each other, and the B-type models are equal to each other. The CECPA values of FIG. 4 were derived using a conventional computation method.

As can be seen in FIG. 4, the models A-3 and B-3 which are smallest in SECPA value and have the same CECPA value are most preferable models. That is, it is understood that an optimum sensor node placement using an extra sensor node like the models A-3 and B-3 is most efficient.

Experimental performance evaluation of the models according to the exemplary embodiments of the present invention will be described below.

First, for performance evaluation, sensor nodes are randomly deployed within an area of 50×50 in², and a coverage ratio is computed using an middle area (50−R)×(50−R) in² of the area. It is assumed that sensing energy consumption per area of each sensor is proportional to second power of its sensing range. The number N of deployed nodes varies 200 to 1,000, and a sensing range R varies 4 m to 12 m. The detailed performance evaluation circumstances are described an article by J. Wu and S. Yang (J. Wu and S. Yang, "Energy-Efficient Node Scheduling Models in Sensor Networks with Adjustable Ranges", International Journal of Foundations of Computer Science, Vol. 16, No. 1, 2005 3-17).

Figure 5:
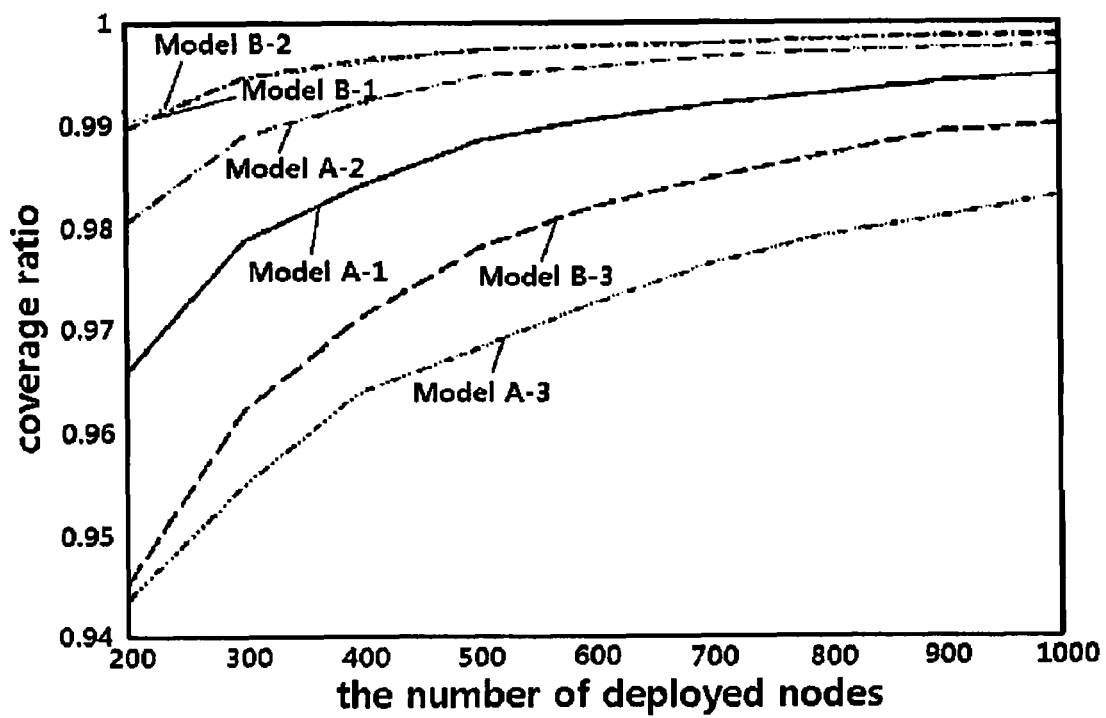
FIG. 5 is a graph illustrating a coverage variation at different node densities according to the exemplary embodiments of the present invention.
Figure 6:
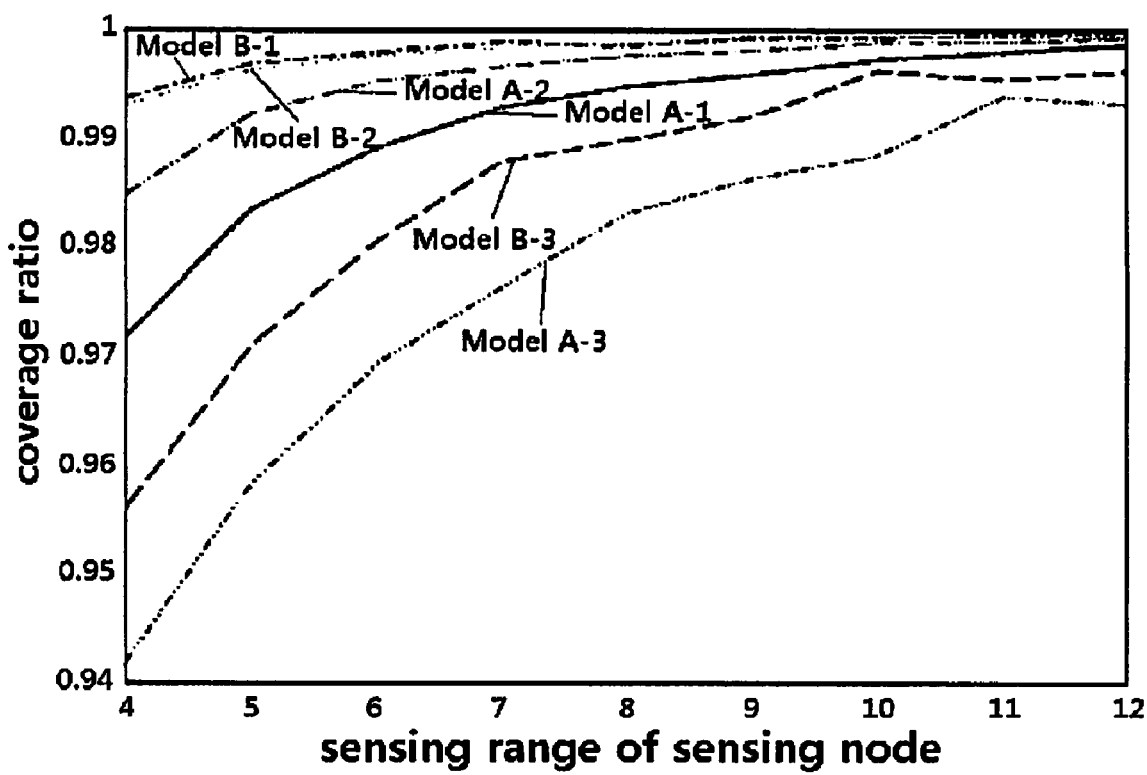
FIG. 6 is a graph illustrating a energy variation at different sensing ranges according to the exemplary embodiments of the present invention

FIG. 5 is a graph illustrating a coverage variation at different node densities according to the exemplary embodiments of the present invention, and FIG. 6 is a graph illustrating a energy variation at different sensing ranges according to the exemplary embodiments of the present invention. In detail, the graph of FIG. 5 shows a correlation between the coverage ratio and the number N of nodes when the sensing range R is 8 m, and the graph of FIG. 6 shows a relationship between the coverage ratio and the sensing range R when the number N of nodes is 1,000.

The coverage ratio is strongly correlated with the SECPA value. That is, the smaller the SECPA value is, the smaller the coverage ratio is. The models B-1 and B-2 have better coverage ratio at a low energy density and a small sensing range. But, it is understood that all the models have good performance in coverage ratio when the node density is high or the sensing range is sufficiently large.

Figure 7:
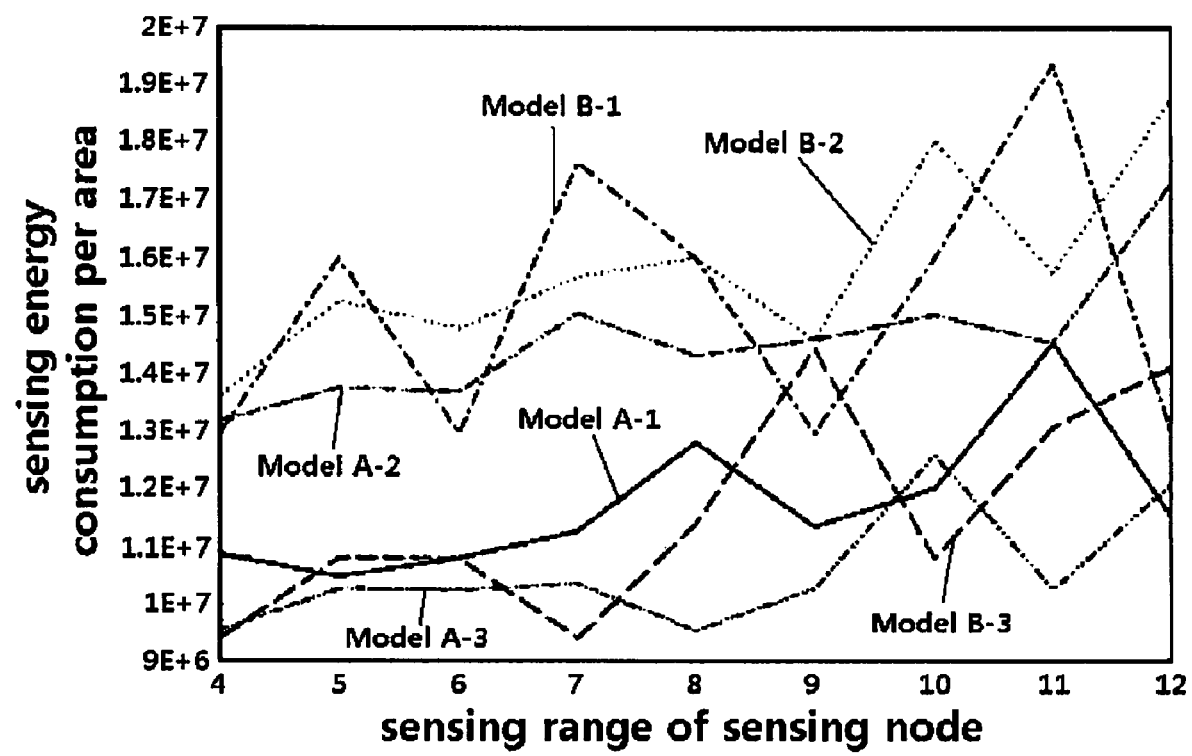
FIGS. 7 and 8 are graphs illustrating energy variations at different sensing ranges according to the exemplary embodiments of the present invention.
Figure 8:
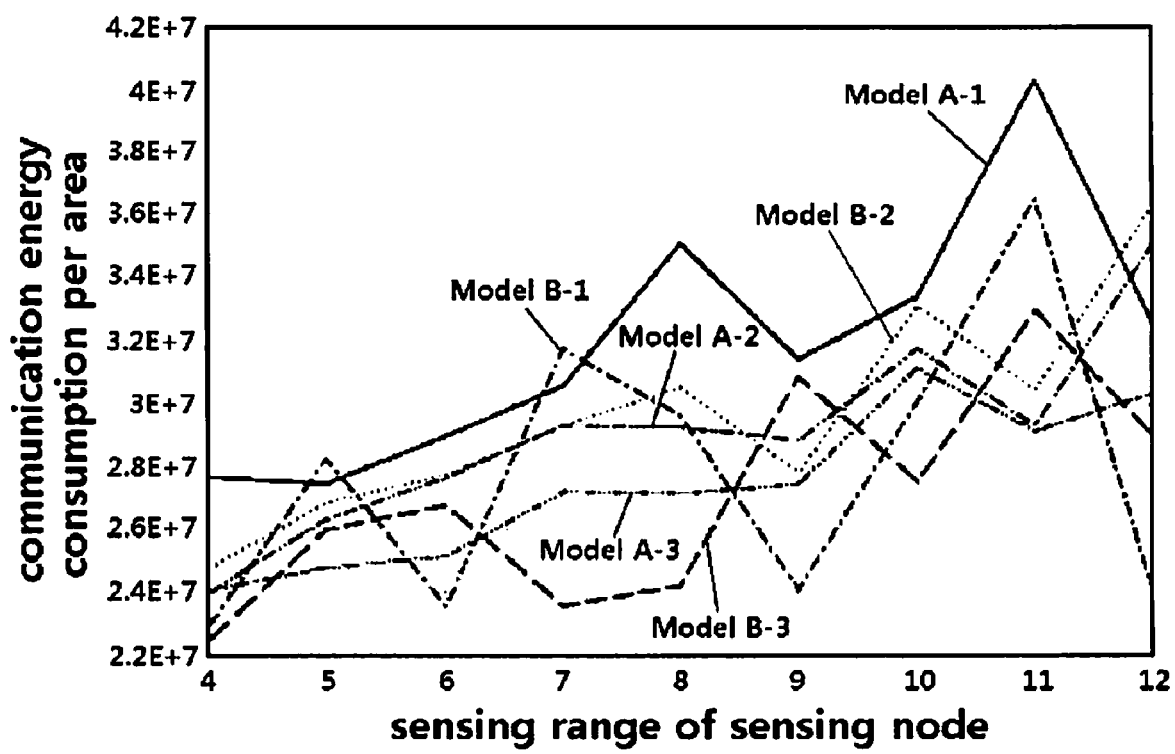

FIGS. 7 and 8 are graphs illustrating energy variations at different sensing ranges according to the exemplary embodiments of the present invention. In detail, the graph of FIG. 7 shows a relationship between a sensing range R and sensing energy consumption per area (SECPA) when the number N of nodes is 1,000, and the graph of FIG. 8 shows a relationship between a sensing range R and communication energy consumption per area (CECPA) when the number N of nodes is 1,000.

It is understood that the models B-1, B-2 and A-2 are larger in SECPA than the model A-1. Sensing energy consumption per area of the model B-3 is very close to that of the model A-1, and the model A-3 outperforms all another models.

Figure 9:
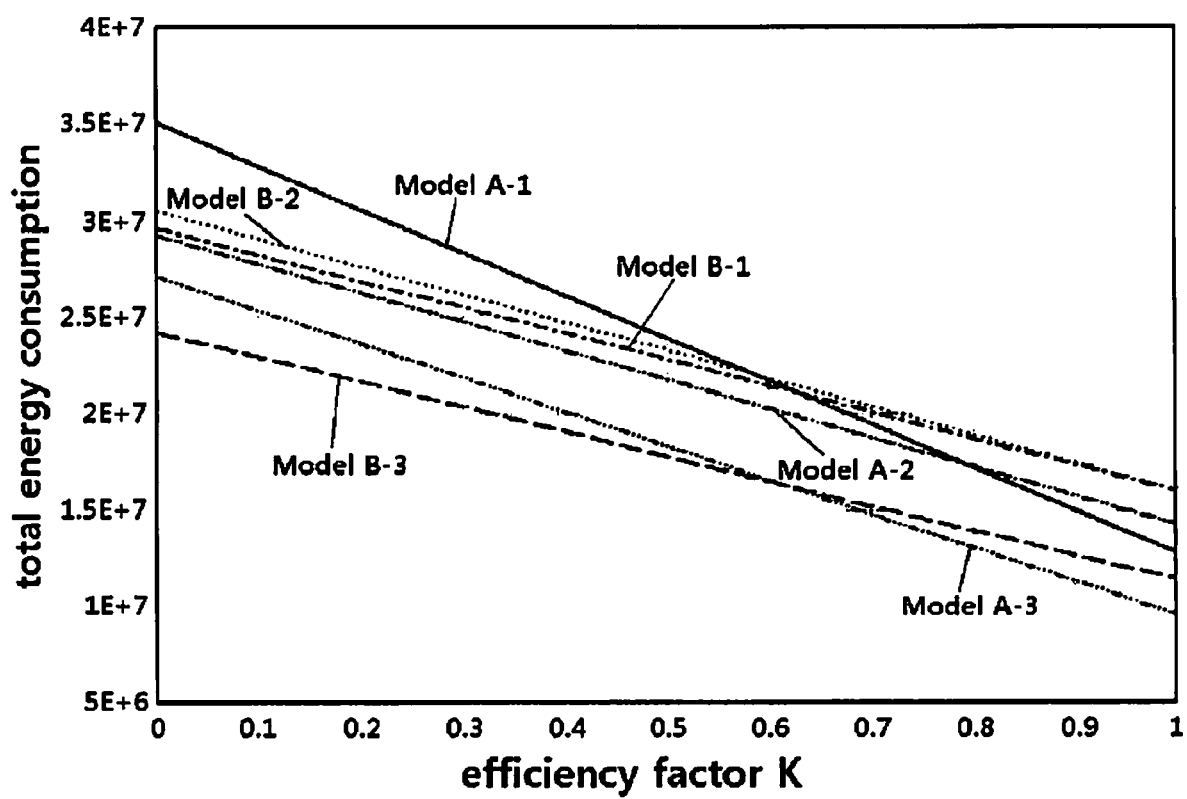
FIG. 9 is a graph illustrating total energy consumption at different ratios K.

Next, FIG. 9 is a graph illustrating total energy consumption at different ratios K.

Referring to FIG. 9, it is understood that best results are achieved in the models A-1 and B-3 when a path loss exponent n is 2. It is also understood that the models A-3 and B-3 are best models even when a path loss exponent n is 4.

According to the wireless sensor network system and the method for placing a plurality of sensor nodes, sensing energy consumption per area of a wireless sensor network system can be minimized by deploying an extra sensor node with the optimum size to cover a gap area which is not covered by sensing areas of sensor nodes.

Moreover, according to the method for computing sensing energy consumption per area of a plurality of sensor nodes, sensing energy consumption per area can be more accurately computed since energy consumption in overlap areas in which sensing areas overlap in a tile area is considered, whereby sensor nodes can be optimally deployed, and sensing area ranges can be optimally set.

While the example embodiments of the present invention and their advantages have been described in detail, it should be understood that various changes, substitutions and alterations may be made herein without departing from the scope of the invention.

What is claimed is:

1. A wireless sensor network system, comprising:
   a plurality of sensor nodes which are deployed at same distance in a two-dimensional plane and have sensing areas of same size; and
   at least one extra sensor node which has a sensing area of a smaller size than the sensing area of the plurality of sensor nodes to sense a gap area which is not covered by the sensing areas of the plurality of sensor nodes,
   wherein the plurality of sensor nodes are deployed such that a tile area defined by connecting three adjacent sensor nodes among the plurality of sensor nodes has an equilateral triangle shape, and the at least one extra sensor node is deployed at a center of the tile area, a radius of the sensing area of the at least one extra sensor node is $r=R/\sqrt{31}\approx 0.1796R$ when the sensing area of the plurality of sensor nodes is R, a length of one side of the tile area is $a=2(R-x)=6R\sqrt{3}/\sqrt{31}\approx 1.8665R$, and a length of a portion of one side of the tile area in which the sensing areas of the plurality of sensor nodes is $2x=2R(\sqrt{31}-3\sqrt{3})/\sqrt{31}\approx 0.1335R$.

2. A wireless sensor network system comprising:
a plurality of sensor nodes which are deployed at same distance in a two-dimensional plane and have sensing areas of same size; and
at least one extra sensor node which has a sensing area of a smaller size than the sensing area of the plurality of sensor nodes to sense a gap area which is not covered by the sensing areas of the plurality of sensor nodes,
wherein the plurality of sensor nodes are deployed such that a tile area defined by connecting four adjacent sensor nodes among the plurality of sensor nodes has a square shape, and the at least one extra sensor node is deployed at a center of the tile area, a radius of the sensing area of the at least one extra sensor node is $r=R/\sqrt{5}\approx 0.4472R$ when the sensing area of the plurality of sensor nodes is R, a length of one side of the tile area is $a=2(R-x)=4R/\sqrt{5}\approx 1.7889R$, and a length of a portion of one side of the tile area in which the sensing areas of the plurality of sensor nodes is $2x=2R(\sqrt{5}-2)/\sqrt{5}\approx 0.2111R$.

3. A method for determining positions of a plurality of sensor nodes in a two-dimensional plane in a wireless sensor network system, comprising:
calculating positions of a plurality of sensor nodes at same distance to have sensing areas of same size by the wireless sensor network system; and
calculating positions of at least one extra sensor node to have a sensing area of a smaller size than the sensing areas of the plurality of sensor nodes and to sense a gap area which is not sensed by the sensing areas of the plurality of sensor nodes by the wireless sensor network system,
wherein the plurality of sensor nodes are deployed such that a tile area defined by connecting three adjacent sensor nodes has an equilateral triangle shape, and the at least one extra sensor node is deployed at a center of the tile area, a radius of the sensing area of the at least one extra sensor node is $r=R/\sqrt{5}\approx 0.4472R$ when the sensing area of the plurality of sensor nodes is R, a length of one side of the tile area is $a=2(R-x)=4R/\sqrt{5}\approx 1.7889R$, and a length of a portion of one side of the tile area in which the sensing areas of the plurality of sensor nodes is $2x=2R(\sqrt{5}-2)/\sqrt{5}\approx 0.2111R$.

4. A method for determining positions of a plurality of sensor nodes in a two-dimensional plane in a wireless sensor network system, comprising:
calculating positions of a plurality of sensor nodes at same distance to have sensing areas of same size by the wireless sensor network system; and
calculating positions of at least one extra sensor node to have a sensing area of a smaller size than the sensing areas of the plurality of sensor nodes and to sense a gap area which is not sensed by the sensing areas of the plurality of sensor nodes by the wireless sensor network system,
wherein the plurality of sensor nodes are deployed such that a tile area defined by connecting four adjacent sensor nodes has a square shape, and the at least one extra sensor node is deployed at a center of the tile area, a radius of the sensing area of the at least one extra sensor node is $r=R/\sqrt{5}\approx 0.4472R$ when the sensing area of the plurality of sensor nodes is R, a length of one side of the tile area is $a=2(R-x)=4R/\sqrt{5}\approx 1.7889R$, and a length of a portion of one side of the tile area in which the sensing areas of the plurality of sensor nodes is $2x=2R(\sqrt{5}-2)/\sqrt{5}\approx 0.2111R$.

* * * * *